United States Patent [19]

Floyd

[11] Patent Number: 4,614,919
[45] Date of Patent: Sep. 30, 1986

[54] MAGNETOSTATIC WAVE FREQUENCY ANALYZER APPARATUS

[75] Inventor: Robert E. Floyd, Acton, Mass.

[73] Assignee: The United States of America as represented by the Secretary of the Air Force, Washington, D.C.

[21] Appl. No.: 627,699

[22] Filed: Jul. 3, 1984

[51] Int. Cl.$^4$ .................. H03H 9/50; H03H 9/70; H01P 1/218

[52] U.S. Cl. .................................. 333/133; 324/80; 333/142; 333/147; 333/186

[58] Field of Search ............... 333/24.1, 24.2, 133, 333/150-155, 186-188, 193-196, 141-142, 144, 145, 147-148, 143, 1, 129; 310/26; 313 R, 313 A, 313 B, 313 C, 313 D; 324/78 R, 78 F, 80-82

[56] References Cited

U.S. PATENT DOCUMENTS

| | | | |
|---|---|---|---|
| 2,455,389 | 12/1948 | Soller | 333/133 |
| 3,727,718 | 4/1973 | Whitehouse | 324/80 X |
| 4,034,288 | 7/1977 | Hartemann | 324/80 |
| 4,379,274 | 4/1983 | Hansen | 333/194 |
| 4,395,686 | 7/1983 | Adam | 333/151 |

OTHER PUBLICATIONS

Pizzarello et al., "Magnetic Steering of Magnetostatic Waves in Epitaxial YIG Films", *J. Appl. Phys.*, 41, 3 pp. 1016-1017, (1970).
Smith et al., "Induction Probing of Magnetostatic Delay Line Fields", *IEEE Trans-Mag*, vol. MAG-15, 6, 1738-1740, (Nov. 1979).
Smith et al., "Anisotropic Propagation of Magnetostatic Waves in Epitaxial YIG Films", *IEEE Trans-Mag*, vol. MAG-17, 6, 2967-2969, (Nov. 1981).

*Primary Examiner*—Marvin L. Nussbaum
*Attorney, Agent, or Firm*—Donald J. Singer; William Stepanishen

[57] ABSTRACT

A magnetostatic wave frequency analyzer apparatus utilizing forward volume waves. A single input transducer is arranged opposite a plurality of output transducers to receive the different frequencies of the generated magnetostatic forward volume wave. A geometric ground plane is positioned in the propagation path between the input transducer and the plurality of output transducers to demonstrate the propagation characteristics of magnetostatic forward volume waves (MSFVW) in the 2-6 GHz range. The waves were propagated in two inch diameter YIG La-doped films of varying thickness (20,30,40 microns). The waves were launched by the microstrip input transducers on an alumina substrate. Receiver transducers were also on the substrate, but placed approximately one inch away, in a semi-circle with 10 degrees of arc between adjacent transducers.

10 Claims, 5 Drawing Figures

MAGNETOSTATIC WAVE FREQUENCY ANALYZER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a microwave signal separator apparatus, and in particular to a magnetostatic wave frequency analyzer apparatus.

Magnetostatic waves, which propagate in a supporting medium such as yttrium iron garnet (YIG) films, have potential applications in microwave delay lines and filters for use in radar, electrical countermeasure equipment and communication systems. Constant delay lines with bandwidths of 400 megahertz and delays of about 100 nanoseconds and linear dispersive chirp delay lines with bandwidths of about 1 gigahertz and differential delays of 200 nanaoseconds have been demonstrated at 9 gigahertz.

A forward surface wave is generated by the input transducer if a magnetic biasing H field is applied in the plane of the film but perpendicular to the direction of propagation. A forward volume wave is generated by the input transducer if the H field is normal to the plane of the film. A backward volume wave is formed by an input transducer when the magnetic biasing H field is in the plane of the film in the direction of propagation of the magnetostatic wave. Typically a magnetostatic wave is generated by passing current through a wire or conductor which is placed adjacent to the YIG film. The magnetic field that surrounds the wire induces the magnetostatic wave which propagates in the YIG film in a direction that is dependent upon the magnitude and orientation of an external magnetic field that created the magnetic biasing H field in the film.

A YIG film of finite width is effectively a magnetostatic waveguide and, in common with electromagnetic and acoustic waveguides, can support the usual desired lowest order mode plus higher order modes of magnetostatic waves. With magnetostatic surface waves, only higher order width modes can exist but with magnetostatic volume waves both higher order thickness and width modes can exist. Higher order modes are launched, along with the lowest order mode, by the input transducer with a launching efficiency that is dependent upon the transducer geometry. Higher order modes of magnetostatic waves are also produced by scattering of the lowest order mode by defects in the YIG film. At the receiving transducer the highest order modes interfere with the lowest order mode, producing amplitude and phase ripple as well as increasing the overall insertion loss of the delay lines.

SUMMARY OF THE INVENTION

The present invention utilizes a thin YIG film which is grown on a gadolinium gallium garnet (GGG) substrate to refract a magnetostatic wave into different frequencies that are received at separated output transducers. An input transducer is utilized to apply the magnetostatic wave to the YIG film region in which there is a ground plane of substantially a triangular shape. In the area of the YIG film above the ground plane metallization, there are differing propagation characteristics which influence the direction of the magnetostatic wave. A magnetic biasing H field which is perpendicular to the plane of the transducers is applied to the YIG film to generate a magnetostatic forward volume wave. A plurality of output transducers which are oriented in an arc at different angles with respect to each other, are positioned opposite the input transducer to receive the different frequencies of the propagated wave that are steered by the ground plane.

It is one object of the present invention, therefore, to provide an improved magnetostatic wave frequency analyzer apparatus.

It is another object of the present invention to provide an improved magnetostatic wave frequency analyzer apparatus which geometrically separates frequencies.

It is yet another object of the present invention to provide an improved magnetostatic wave frequency analyzer apparatus to separate a magnetostatic wave into different frequencies.

It is still another object of the present invention to provide an improved magnetostatic wave frequency analyzer apparatus to provide real time frequency separation.

It is still a further object of the present invention to provide an improved magnetostatic wave frequency analyzer apparatus which is tunable in frequency.

It is yet another object of the present invention to provide an improved magnetostatic wave frequency analyzer apparatus which utilizes a bias electromagnet to scan up and down in frequency.

These and other advantages, objects and features of the invention will become more apparent from the following description when taken in connection with the illustrative embodiment in the accompanying drawings.

DESCRIPTION OF THE PREFERRED EMBODIMENT

Figure 1:
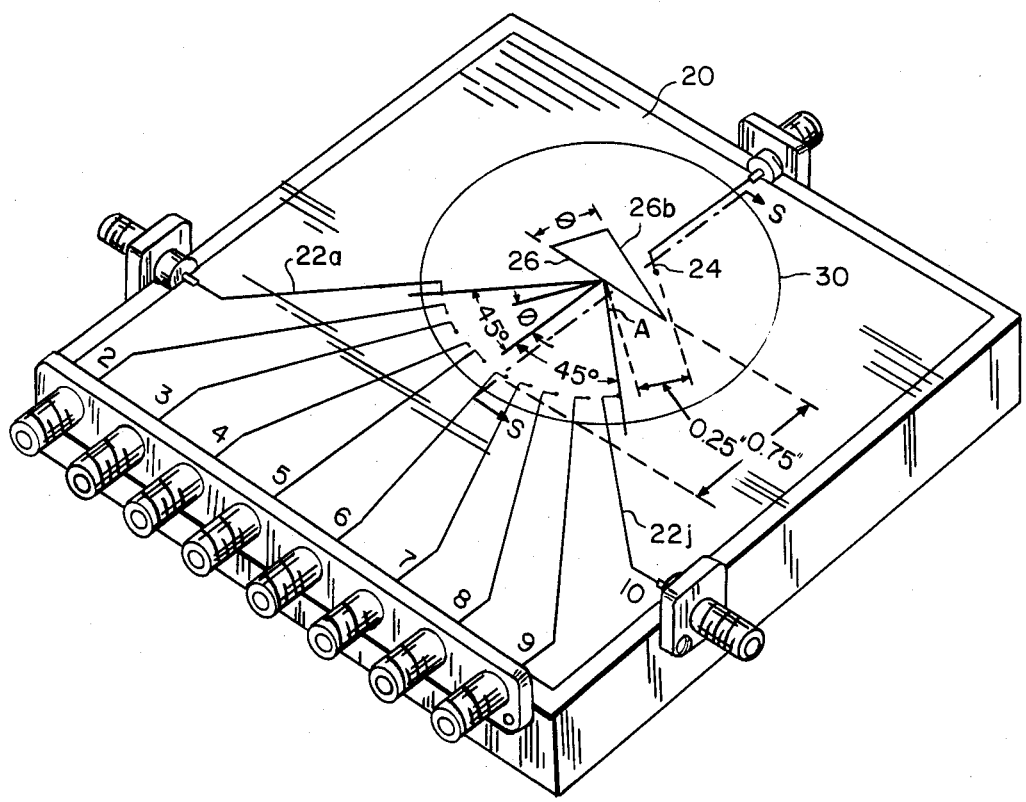
FIG. 1 is a top view of the magnetostatic wave frequency analyzer apparatus according to the present invention.

Referring now to FIG. 1, there is shown a magnetostatic wave frequency analyzer apparatus for propagating magnetostatic forward volume waves (MSFVW). An alumina ($Al_2O_3$) substrate 20 with a non-magnetic metallic ground (not shown in this view) on its bottom surface has a plurality of output transducers 22a–22j and a single input transducer 24 positioned on its top surface. A non-magnetic metallic ground plane 26 having a substantially triangular configuration is positioned on the top surface of the alumina substrate 20 between the input transducer 24 and the circular arrangement of output transducers 22a–22j. The output transducers 22a–22j have a spacing of 10° between each other over a 90° angle. The reference point A is approximately 0.75 inches from the center of the arc (or circular section) in which the output transducers 22a–22j are aligned. The input transducer 24 is approximately 0.25 inches from reference point A. It should be noted that side 26b of ground plane 26 is substantially parallel to input transducer 24. Output connectors 1–10 are attached to the individual output transducers 22a–22j. The input transducer 24 is connected to an input connector 24a.

A gadolinium gallium garnet (GGG) substrate 30 with a thin YIG film (not shown in this view) which is approximately two inches in diameter is positioned on top of the input transducer 24, the ground plane 26, and the plurality of output transducers 22a–22j. The YIG film which is grown on the bottom surface of the GGG substrate 30 is in contact with the elements 24, 22a–22j, and 26, but is not in contact with the alumina substrate 20. The input transducer 24, the output transducers 22a–22j, and the ground plane 26 have a height or thickness of approximately five microns which isolates the YIG film from the alumina substrate 20 and provides an air gap therebetween. These features will be shown in greater detail in FIG. 2.

Figure 2:
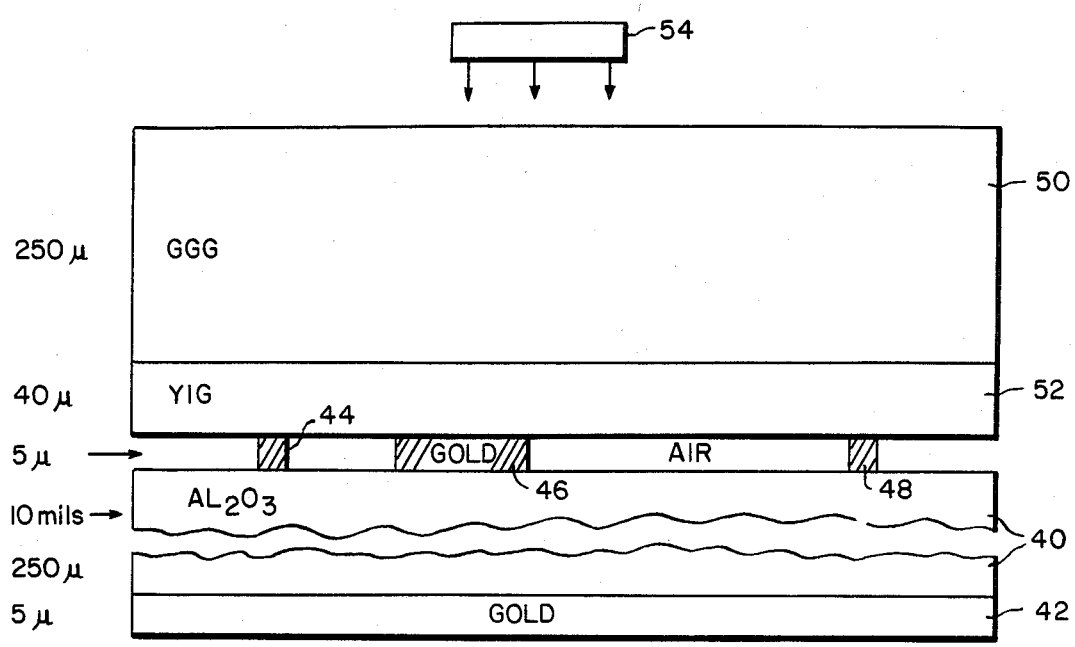
FIG. 2 is a cross-sectional view of the apparatus in FIG. 1 taken along the S—S to show in greater detail the elements of the magnetostatic wave frequency analyzer apparatus.

Turning now to FIG. 2, there is shown a cross-sectional view of the magnetostatic wave frequency analyzer apparatus of FIG. 1 taken along section line S—S. The alumina substrate 40 which is shown as approximately 250 microns, comprises $Al_2O_3$. However, any suitable compatible substrate material may also be utilized. A ground plane 42 comprising approximately 5 microns of gold is deposited on the surface of the alumina substrate 40. There is shown deposited on the top surface of the alumina substrate 40 the respective elements 44, 46, 48 which are cross-section slices of the input transducer 44, the ground plane 46 and the output transducer 48. The elements 44, 46 and 48 are shown as being comprised of gold, however, both these elements 44, 46 and 48 and the ground plane 42 may be comprised of any type of suitable non-magnetic metallic material such as copper, aluminum or the like. The elements 44, 46 and 48 have height or thickness of approximately five microns. A substrate 50 of gadolinium gallium garnet (GGG) which is approximately 250 microns thick, has a forty micron film 52 of YIG grown on the bottom surface thereof. The YIG film 52 which is on the bottom of the substrate 50 is placed in contact with the elements 44, 46 and 48 to form an air gap therebetween as shown of approximately five microns.

A magnetic biasing field generating means 54 is shown perpendicular to the plane surface of the alumina substrate 40 on which the input transducer 44, the ground plane 46 and the output transducers 48 are disposed. The magnetic biasing field generating means 54 generates a magnetic biasing H field which is utilized to establish a forward volume wave between the input transducer 44 and the output transducer 48.

Figure 3:
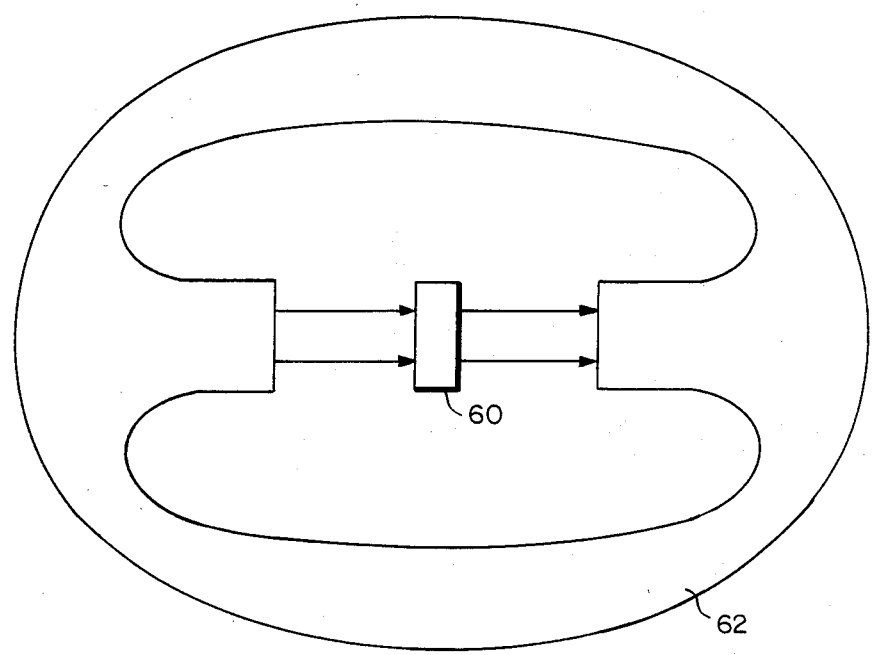
FIG. 3 is a front view of the electromagnet biasing apparatus.

In FIG. 3 there is shown a magnetostatic wave frequency analyzer apparatus 60 which is positioned perpendicularly to the magnetic biasing H field that is created by the large magnet device 62. The magnet unit 62 is a large electromagnetic device such as the Harvey Wells Electromagnet L-128, stock number 6625-L0048442835 which is commerically available. The magnet unit 62 has a magnetic biasing output in the range of 0–20 kilogauss and is typically operated at approximately 2780 gauss.

Network analyzer measurements were taken of various device configurations, and comparisons of output channels show that there is a wide spreading of the magnetostatic forward volume wave (MSFVW) beam, especially the longer wavelengths. The films which were used initially without interceding ground planes also exhibited some natural beam steering. However, the best steering results were achieved with the configuration of FIG. 1 which includes a ground plane. The channel which exhibited the least insertion loss was not always the channel that was parallel to the input. Results shown in FIGS. 4 and 5 were obtained for oblique incidence of these forward volume waves on a closely spaced metallized surface. The steering effects are due to boundary conditions. This effect is utilized in the magnetostatic wave frequency analyzer apparatus for frequency selective steering and thereby frequency separation. It has been noted that long wavelengths are strongly divergent, spread out, while the shorter wavelengths can be controllably steered by field inhomogeneities. These effects can be used to eliminate undesirabe long wavelengths from the passband of delay line filters.

Figure 4:
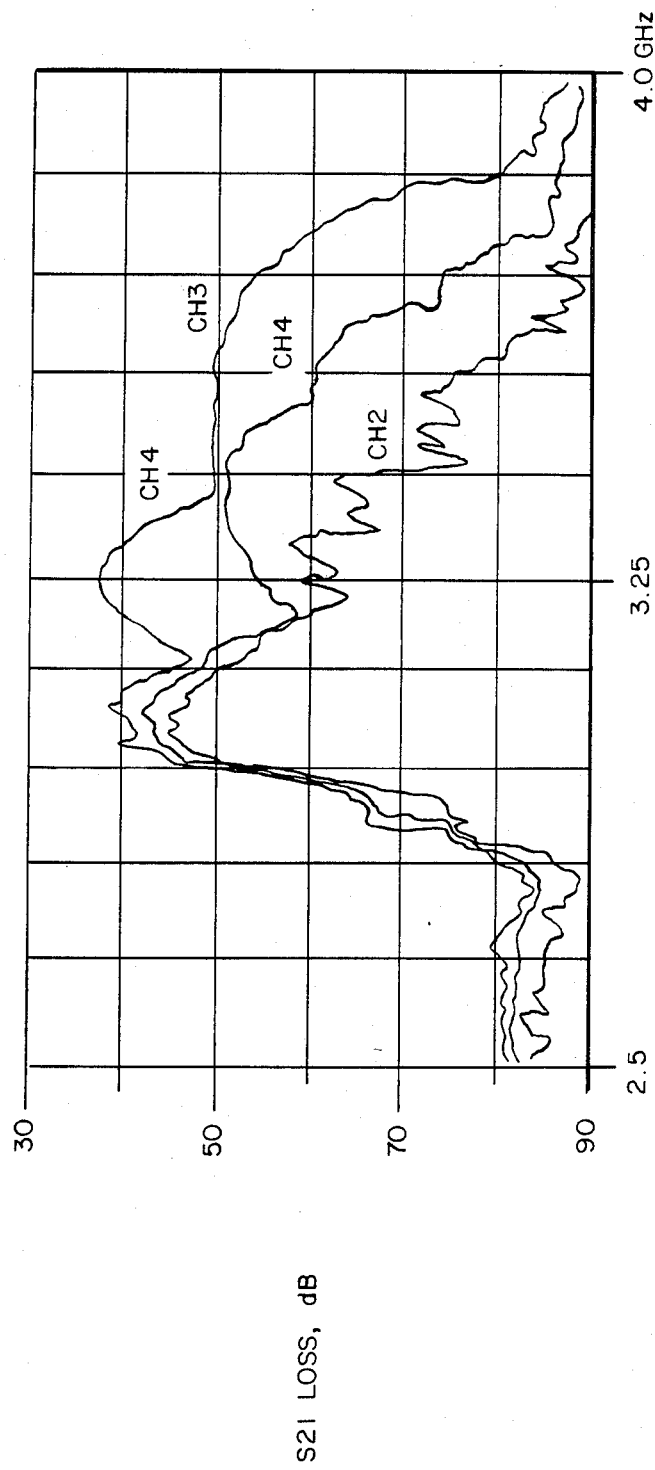
FIG. 4 is a graphical representation of the insertion loss of channels 2, 3 and 4.
Figure 5:
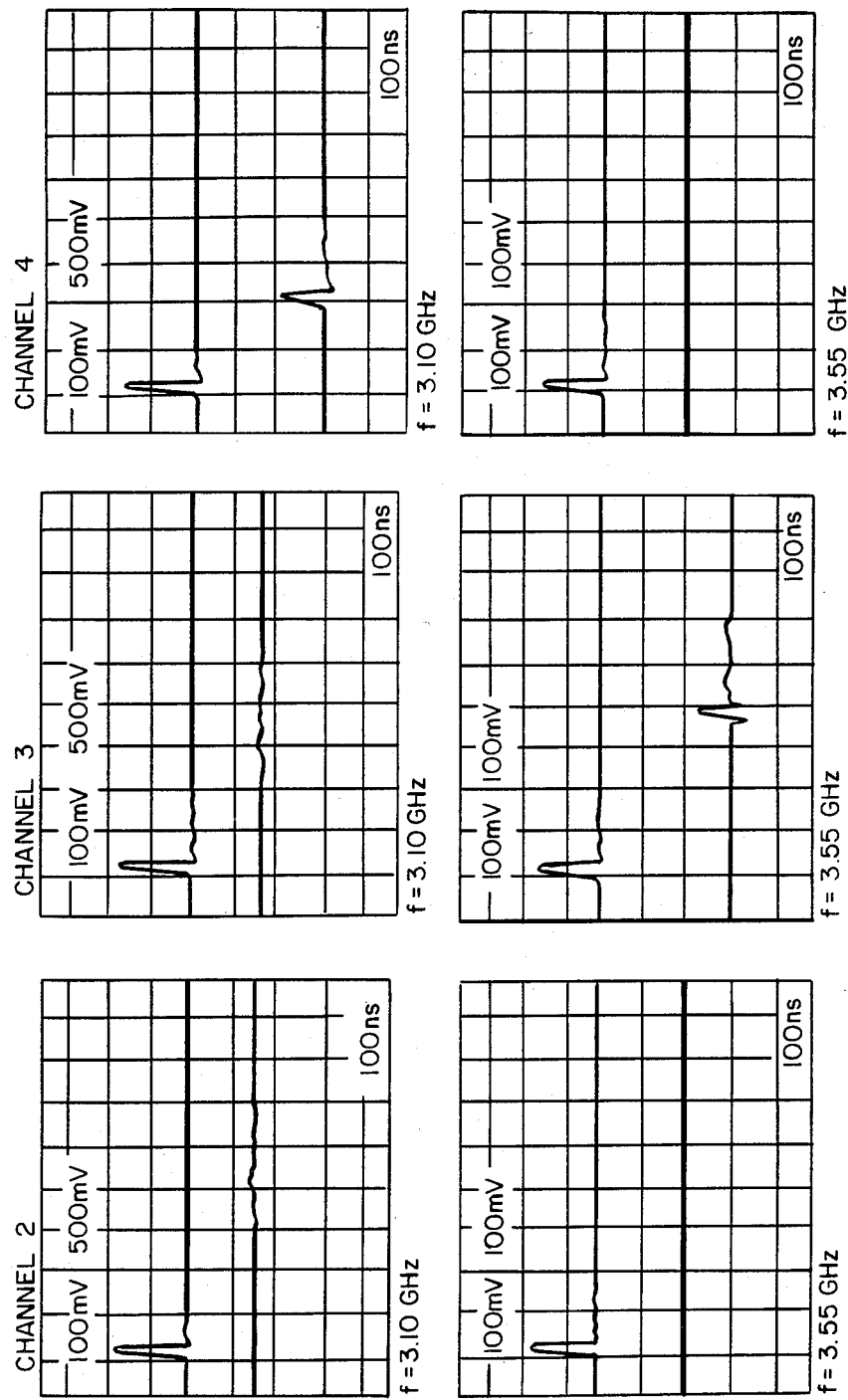
FIG. 5 is a graphical representation of the response of channels 2, 3 and 4 to a CW pulse for two different frequencies.

The geometry of the experimental apparatus set on a three inch square alumina substrate. The input transducer has a 4 mm aperture. Each of ten output transducers have an aperture of 2.5 mm, and are arranged in a semi-circle with 10 degrees of arc between each transducer. A two inch diameter EPI grown La-doped YIG film is flipped onto the substrate as shown in FIGS. 1 and 2. The magnetostatic forward volume waves (MSFVW) propagate in a delay line configuration along an approximately one inch path. A metallized surface was introduced into the propagation path and provided a 25° oblique incidence boundary condition for the magnetostatic forward volume waves (MSFVW). FIG. 4 shows the passbands of three channels with a metallization in place and the insertion loss measurements of three selected channels. It may be seen that the long wavelengths spread to all channels, while middle wavelengths are steered to channel 4 and the shorter wavelengths are less affected and are received at channel 3. The middle and long wavelength steering is consistent with diffraction at an abrupt discontinuity.

The steering mechanism is due to the refraction of the wave front. The ground plane region introduces a boundary where there are now two regions with different propagation velocities. Using this as a basis, a theoretical expression was derived and reduced to the following, $$\tan \theta = (1 - k_1/k_2) \tan \phi \tag{1}$$

$k_1$, $k_2$ are the wave numbers in their respective regions, $\phi$ = angle of incidence and $\theta$ is the angle of refraction from $\phi$. Results from this expression are in good agreement with the experimental results shown in FIG. 5.

In Table 1, there is shown the angles of refraction, $\theta$, that occurs for the various frequencies listed in gigahertz (GHz).

TABLE 1

PREDICTED STEERING ANGLES
FOR OBLIQUE INCIDENCE
ON A CLOSELY SPACED METALLIZED REGION

| FREQUENCY, GHz | THETA, DEG |
|---|---|
| 3.15 | 14.00 |
| 3.20 | 12.26 |
| 3.25 | 10.69 |
| 3.30 | 9.55 |
| 3.35 | 8.58 |
| 3.40 | 7.67 |

TABLE 1-continued

| PREDICTED STEERING ANGLES FOR OBLIQUE INCIDENCE ON A CLOSELY SPACED METALLIZED REGION | |
|---|---|
| FREQUENCY, GHz | THETA, DEG |
| 3.45 | 6.75 |
| 3.50 | 5.82 |
| 3.55 | 4.90 |
| 3.60 | 4.03 |
| 3.65 | 3.23 |
| 3.70 | 2.53 |
| 3.75 | 1.94 |
| 3.80 | 1.46 |
| 3.85 | 1.07 | wherein the following parameters are defined as follows: H=2780 Gauss, T1=300 Microns, D=40 Microns, LA=40 microns and LB=1000 Microns.

Some CW pulse measurements were done to demonstrate the ability of this device to separate two simultaneous CW frequencies. FIG. 6 shows the outputs of three channels (2,3,4) for two pulse measurements. When the frequency was at 3.1 GHz only channel 4 received the pulses. When the frequency was at 3.55 GHz the output only appeared at channel 3. Thus, frequency selective steering was induced by oblique incidence on the ground plane region.

Frequency selective steering of magnetostatic forward volume waves is clearly demonstrated by using a closely spaced metallization as shown in FIG. 1. The oblique incidence upon this boundary of the forward volume wave steered the middle portion of an magnetostatic forward volume wave (MSFVW) passband to an adjacent output channel. The CW pulse measurements confirmed operation of this geometric frequency separator.

Although the invention has been described with reference to a particular embodiment, it will be understood to those skilled in the art that the invention is capable of a variety of alternative embodiments within the spirit and scope of the appended claims.

What is claimed is:

1. A magnetostatic wave frequency analyzer apparatus utilizing forward volume waves comprising in combination:

an alumina substrate with a non-magnetic ground plane disposed on the bottom surface thereof, an input transducer disposed on the top surface of said alumina substrate, said input transducer comprising a non-magnetic material, a plurality of output transducers remotely positioned on said top surface of said alumina substrate opposite said input transducer, said plurality of output transducers arranged in a substantially circular configuration with a predetermined number of degrees between adjacent output transducers, a ground plane means positioned on the top surface of said substrate in close proximity to said input transducer, said ground plane means having a predetermined geometric configuration, said ground plane means having one side substantially parallel to said input transducer, a substrate means positioned over and in close proximity to the top surface of said input transducer, said ground plane means, and said plurality of output transducers, said substrate means having a magnetic film deposited on its bottom surface in close proximity to said input transducers, said ground plane means and said plurality of output transducers, and, a magnet means for generating a magnetic biasing H field, said magnetic biasing H field being applied perpendicularly to the plane of said input transducer, said ground plane means, and said plurality of output transducers, said magnetic biasing H field having a predetermined bias strength.

2. A magnetostatic wave frequency analyzer apparatus as described in claim 1 wherein said non-magnetic ground plane comprises a gold material.

3. A magnetostatic wave frequency analyzer apparatus as described in claim 1 wherein said input transducer, said ground plane means and said plurality of output transducers comprise a gold material.

4. A magnetostatic wave frequency analyzer apparatus as described in claim 1 wherein said substantially circular configuration comprises a 90° arc.

5. A magnetostatic wave frequency analyzer apparatus as described in claim 1 wherein said predetermined geometric configuration comprises a triangular shape.

6. A magnetostatic wave frequency analyzer apparatus as described in claim 1 wherein said predetermined number of degrees equals 10°.

7. A magnetostatic wave frequency analyzer apparatus as described in claim 1 wherein said input transducer, said ground plane means, and said plurality of output transducers have a predetermined thickness.

8. A magnetostatic wave frequency analyzer apparatus as described in claim 1 wherein said substrate means comprises gadolinium gallium garnet.

9. A magnetostatic wave frequency analyzer apparatus as described in claim 7 wherein said input transducer, said ground plane means, and said plurality of output transducers have the same thickness.

10. A magnetostatic wave frequency analyzer apparatus as described in claim 7 wherein said predetermined thickness is five microns.

* * * * *